(12) United States Patent
Nobbe et al.

(10) Patent No.: US 8,644,776 B1
(45) Date of Patent: Feb. 4, 2014

(54) SYSTEMS AND METHODS FOR PROVIDING IMPROVED POWER PERFORMANCE IN WIRELESS COMMUNICATION SYSTEMS

(75) Inventors: Dan Nobbe, Crystal Lake, IL (US); Robert Broughton, Chester, NH (US); Tero Ranta, San Diego, CA (US); James Swonger, Cocoa, FL (US); R. Mark Englekirk, Pacific Palisades, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 1047 days.

(21) Appl. No.: 12/197,681

(22) Filed: Aug. 25, 2008

(51) Int. Cl.
*H03C 1/62* (2006.01)
*H04K 3/00* (2006.01)

(52) U.S. Cl.
USPC .................................. 455/115.1; 455/126

(58) Field of Classification Search
USPC ........ 455/115.1–115.4, 126; 333/81 R, 81 A, 333/81 B
See application file for complete search history.

(56) References Cited

U.S. PATENT DOCUMENTS

| | | | |
|---|---|---|---|
| 4,609,781 A * | 9/1986 | Gay | 379/400 |
| 5,564,086 A | 10/1996 | Cygan et al. | |
| 5,710,991 A * | 1/1998 | Lee | 455/126 |
| 6,029,051 A * | 2/2000 | Osterberg et al. | 455/115.1 |
| 6,108,527 A | 8/2000 | Urban et al. | |
| 6,239,658 B1 | 5/2001 | Tham | |
| 6,265,939 B1 | 7/2001 | Wan et al. | |
| 6,472,860 B1 | 10/2002 | Tran et al. | |
| 6,504,403 B2 | 1/2003 | Bangs et al. | |
| 6,727,754 B2 | 4/2004 | Dupuis et al. | |
| 6,731,915 B1 | 5/2004 | Tran et al. | |
| 6,756,849 B2 | 6/2004 | Dupuis et al. | |
| 6,927,630 B2 | 8/2005 | Dupuis et al. | |
| 7,010,284 B2 | 3/2006 | Liu et al. | |
| 7,038,609 B1 | 5/2006 | Hurrell | |
| 7,042,285 B2 | 5/2006 | Parkhurst et al. | |
| 7,071,776 B2 | 7/2006 | Forrester et al. | |
| 7,095,256 B1 | 8/2006 | Zhak et al. | |
| 7,113,754 B2 | 9/2006 | Chien | |
| 7,116,948 B2 | 10/2006 | Chien | |
| 7,260,367 B2 | 8/2007 | McMorrow et al. | |
| 7,348,853 B2 | 3/2008 | Camnitz et al. | |
| 7,353,006 B2 | 4/2008 | Gels et al. | |
| 2005/0059362 A1 | 3/2005 | Kalajo et al. | |
| 2007/0182490 A1 | 8/2007 | Hau et al. | |
| 2007/0287393 A1 | 12/2007 | Nandipaku et al. | |

OTHER PUBLICATIONS

Hu, Stacy, "A 450MHz CMOS RF Power Detector", IEEE Radio Frequency Integrated Circuits Symposium, 2001, pp. 209-212, US.

\* cited by examiner

*Primary Examiner* — Lee Nguyen
(74) *Attorney, Agent, or Firm* — Gesmer Updegrove LLP

(57) ABSTRACT

A power detection system is disclosed that determines a power level of a transmission signal. The power detection system includes an adjustable comparator circuit, an algorithmic state machine, and an output node. The adjustable comparator circuit receives the transmission signal and provides an adjusted transmission signal, and further compares the adjusted transmission signal to a reference signal. The algorithmic state machine iteratively adjusts the adjustable comparator circuit until the adjusted transmission signal is substantially close to the reference signal. The output node is coupled to the algorithmic state machine and provides an output signal that is responsive to the power level of the transmission signal and to the reference signal.

35 Claims, 9 Drawing Sheets

SYSTEMS AND METHODS FOR PROVIDING IMPROVED POWER PERFORMANCE IN WIRELESS COMMUNICATION SYSTEMS

BACKGROUND

The present invention generally relates to power detectors for use in wireless communication systems, and relates in particular to systems and method for reducing power consumption and improving power control of a wireless communication system.

Wireless communication systems generally include transmitter and receiver circuits that have power (e.g., current) requirements that vary during use, due at least in part, to usage, network characteristics, and antenna characteristics. For example, the power required for signal transmission through an antenna may vary, and it is generally important to monitor the output power of the transmitter during use. Failure to monitor this output power may result in too little power being employed, which may lead to dropped calls, or may result in too much power being used, which may lead to decreased useful battery life and/or network jamming.

For example, U.S. Pat. No. 6,265,939 discloses a power detector that employs a rectifying diode circuit that senses a peak RF signal coupled thereto, and the circuit provides a linear power detection functionality.

U.S. Pat. No. 7,353,006 disclose systems and methods for detecting output power in a transmission system that includes a power amplifier, a track and hold circuit, a log power detector in a feedback path, and a log power detector in a reference path in communication with the track and hold circuit. Such systems provide a wider range of detection of a logarithmic scale, but operate continuously and consume an amount of current that is not insubstantial, at least in part, due to the fact that such systems employ the use of logarithmic amplifiers in the power detection circuits.

Battery power requirements of wireless transmission systems that employ power amplifiers typically require that current use be minimized. U.S. Pat. No. 6,756,849 discloses power detector systems for CMOS devices that employ a first envelope detector that is coupled to a voltage sensor, and a second envelope detector that is coupled to a current sensor. Although the system is disclosed to be suitable for use with CMOS systems that employ dual gate oxide devices for using two power levels, the envelope detectors are disclosed to be logarithmic amplifiers in accordance with an embodiment, and the system operates continuously.

It is also known that transmission circuits and coupling interfaces present a certain amount of impedance and reflected power, and that it is generally desirable to reduce any varying mismatches in load impedance that may occur during use. U.S. Pat. No. 5,564,086 discloses a system that includes a variable matching network, a directional coupler, and a processor that digitizes the forward and reflected components, and provides a feedback control signal to the variable matching network. U.S. Patent Application Publication No. 2005/0059362 discloses a power amplifier that internally corrects for any load mismatch without the use of a separate variable matching network, but instead provides mismatch protection within the power amplifier itself, which requires additional circuitry in the power amplifier.

There is a need, therefore, for a system and method for providing power detection with reduced current requirements, and in particular a need for providing a system and method for detecting forward and reflected power in a transmission system, and for determining the magnitude of impedance mismatch in a transmission system in a wireless communication system.

SUMMARY

The invention provides a power detection system that determines a power level of a transmission signal. In accordance with an embodiment, the power detection system includes an adjustable comparator circuit, an algorithmic state machine, and an output node. The adjustable comparator circuit receives the transmission signal and provides an adjusted transmission signal, and further compares the adjusted transmission signal to a reference signal. The algorithmic state machine iteratively adjusts the adjustable comparator circuit until the adjusted transmission signal is substantially close to the reference signal. The output node is coupled to the algorithmic state machine and provides an output signal that is responsive to the power level of the transmission signal and to the reference signal.

In accordance with a further embodiment, the invention provides a power detection system that is coupled to a transmission path of a wireless communication circuit. The power detection system includes a first adjustable comparator circuit, a first algorithmic state machine, a second adjustable comparator circuit, a second algorithmic state machine, and an output node. The first adjustable comparator circuit receives a transmission signal and provides an adjusted transmission signal, and further compares the adjusted transmission signal to a reference signal. The first algorithmic state machine iteratively adjusts the first logarithmic adjustable comparator circuit until the adjusted transmission signal is substantially close to the reference signal. The second adjustable comparator circuit receives a second signal and provides a second adjusted signal, and further compares the second adjusted signal to a second reference signal. The second algorithmic state machine iteratively adjusts the second logarithmic adjustable comparator circuit until the second adjusted signal is substantially close to the second reference signal. The output node is coupled to the second algorithmic state machine and provides an output signal that is responsive to the transmission signal, the second signal, and the first and second reference signals.

In accordance with a further embodiment, the invention provides a method of determining a difference between a power level of a forward signal within a transmission channel and a power level of a reflected signal from the transmission channel. The method includes the steps of providing an adjusted forward signal to a first comparator, comparing the adjusted forward signal to a first reference signal, and providing a first digital signal to a first algorithm state machine and further adjusting the adjusted forward signal until the adjusted forward signal is substantially close to the first reference signal. The method also includes the steps of providing an adjusted reflected signal to a second comparator, comparing the adjusted reflected signal to a second reference signal, providing a second digital signal to a second algorithm state machine, further adjusting the adjusted reflected signal until the adjusted reflected signal is substantially close to the second reference signal, and providing an output signal that is representative of a difference between the power level of the forward signal and the power level of the reflected signal.

BRIEF DESCRIPTION OF THE DRAWINGS

The following description may be further understood with reference to the accompanying drawings in which.

The drawings are shown for illustrative purposes only.

DETAILED DESCRIPTION

The invention provides a power detection system and method whereby power (e.g., the AC amplitude of a transmission signal) may be detected in a wireless communication system, and further that a mismatch may be detected between transmit power and reflected power in a wireless communication system that employs a transmission antenna. The degree of mismatch between the transmit power and reflected power is indicative of the impedance matching in the transmission circuit. For example, if the impedance is well matched, the difference between the transmission power and the reflected power should be significant, but if the impedance is not well matched, then the power difference will be much lower. Information regarding this power difference may be used to improve the impedance matching of the transmission circuit.

Figure 1:
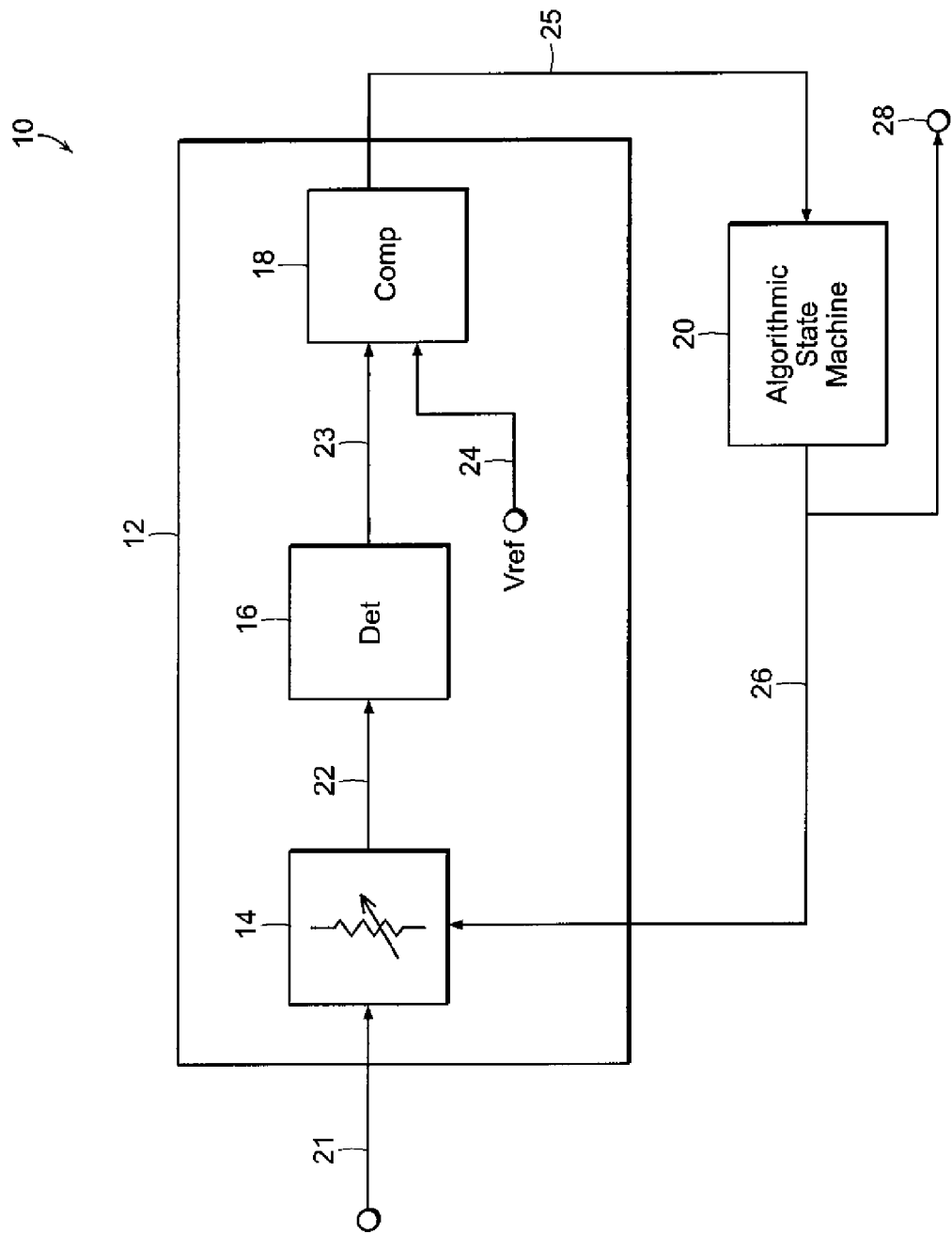
FIG. 1 shows an illustrative diagrammatic view of a power detection system in accordance with an embodiment of the invention.

FIG. 1 shows a power detection system in accordance with an embodiment of the invention in which the system 10 includes an adjustable attenuation comparator circuit 12 that includes an adjustable attenuator 14, a detector circuit 16 and a comparator circuit 18. The system 10 also includes an algorithmic state machine 20. An input signal 21 (such as the AC amplitude of a transmission signal) is adjusted by the adjustable attenuator 14, which produces an attenuator output signal 22. The signal 22 is provided to the detector circuit 16 (such as a peak or envelope detector), the output of which (signal 23) is provided to the comparator circuit 18 where the signal 23 is compared to a reference voltage 24 $V_{ref}$. The output of the comparator 18 is provided to the algorithmic state machine 20, which iteratively adjusts the adjustable attenuator 14 until the signal 23 is substantially close to $V_{ref}$. In accordance with various embodiments, the power detection system may detect a power level of either a transmission signal that is being output to an antenna in a wireless communication system, or may detect a power level of a received signal that is received from an antenna in a wireless communication system.

The algorithmic state machine iteratively adjusts the adjustable comparator circuit based on any of a variety of search algorithms, such as for example a binary search algorithm or a linear (incremental) search algorithm. The algorithmic state machine, for example, may adjust the adjustable comparator circuit until the polarity of the signal 25 reverses, indicating that the signal 23 has just passed the voltage $V_{ref}$. The adjustable attenuator 14, detector circuit 16 and the comparator circuit 18 may be provided as discrete circuits or may be combined in a single circuit that provides the desired functionality. Further, the signal 23 may provide an adjusted power signal that is compared with the reference voltage (as shown in FIG. 1), or in further embodiments, the detector may be omitted, and the signal 22 may provide the adjusted power signal that is compared with the reference voltage.

Advantageously, the system is not required to include log amplifiers to provide a logarithmic range of operation because the adjustable attenuator may be a logarithmically adjustable attenuator. For example, the AC amplitude of a transmission signal may be detected and the reference voltage $V_{ref}$ may be set to the expected AC peak voltage of the transmission signal. The attenuator adjusts the detected transmission signal until the adjusted transmission signal is substantially close to the reference voltage. The amount that the adjustable attenuator (e.g., a successive approximation register) is required to be adjusted (until the adjusted transmission signal is substantially close to the reference voltage), is indicative of an adjustment value. The adjustment value, together with the reference voltage, is indicative of the AC amplitude of the transmission signal, which is indicative of the power level of the transmission signal.

Figure 2:
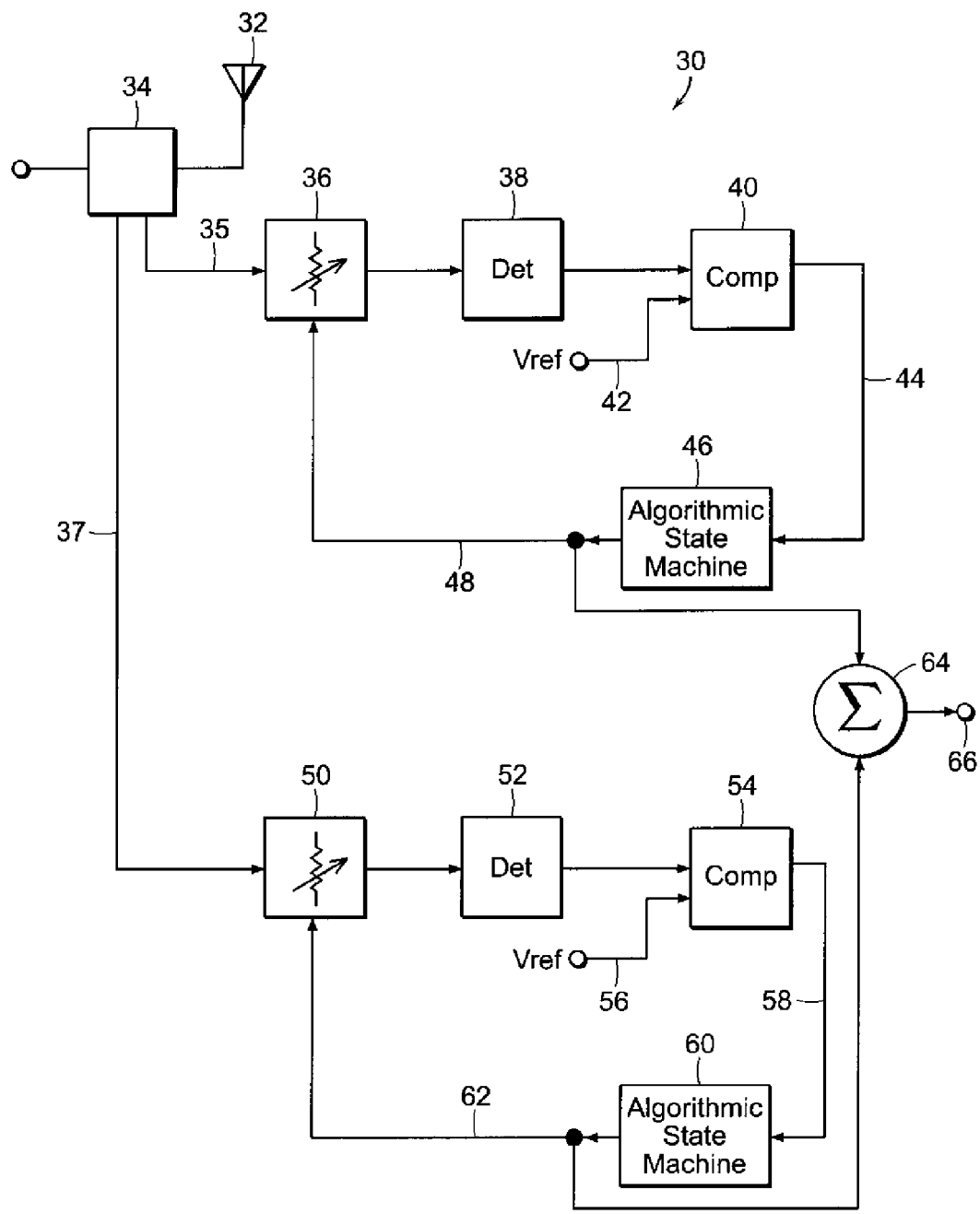
FIG. 2 shows an illustrative diagrammatic view of a power mismatch detection system in accordance with a further embodiment of the invention in which a mismatch between forward and reflected power in a transmission antenna may be detected.

FIG. 2 shows a power mismatch detector system in which a mismatch between forward power and a reflected power is detected by measuring one of these values and then finding a difference between the two. As shown in FIG. 2, a mismatch detector system 30 in accordance with an embodiment includes a directional coupler 34 between a power transmitter output and an output antenna 32 in a wireless communication system. The directional coupler couples a small portion of the forward path power signal to one signal path (e.g., line 37) and couples a small portion of the reflected power signal that is reflected from the antenna to a different signal path (e.g., line 35).

The reverse path circuit includes a first adjustable attenuator circuit 36, a first detector 38, a first comparator 40 and a first algorithmic state machine 46. The forward signal path circuit includes a second adjustable attenuator circuit 50, a second detector 52, a second comparator 54 and a second algorithmic state machine 60. Each of the signal paths operates as discussed above with reference to FIG. 1 wherein the algorithmic state machine (46, 60) iteratively adjusts the respective adjustable attenuator (36, 50) until the signal into each comparator (40, 54) is substantially close to $V_{ref}$(42, 56). In certain embodiments, the $V_{ref}$ voltages at (42, 56) may be the same as one another, or may be different than one another. The outputs of the algorithmic state machines 46, 60 are combined by a combiner 64 to provide a system output 66 that indicates whether a mismatch exists and if so, the amount of mismatch that exists, between the forward power and the reflected power.

With a system that detects both a forward power and a reverse power, one would expect higher power on the fore path than on the reverse path, so in certain embodiments, one may converge on the reverse power and then adjust the delta on the forward path. The return loss is provided by the amount that one needs to attenuate the forward path as compared to the reverse path.

Figure 3A:
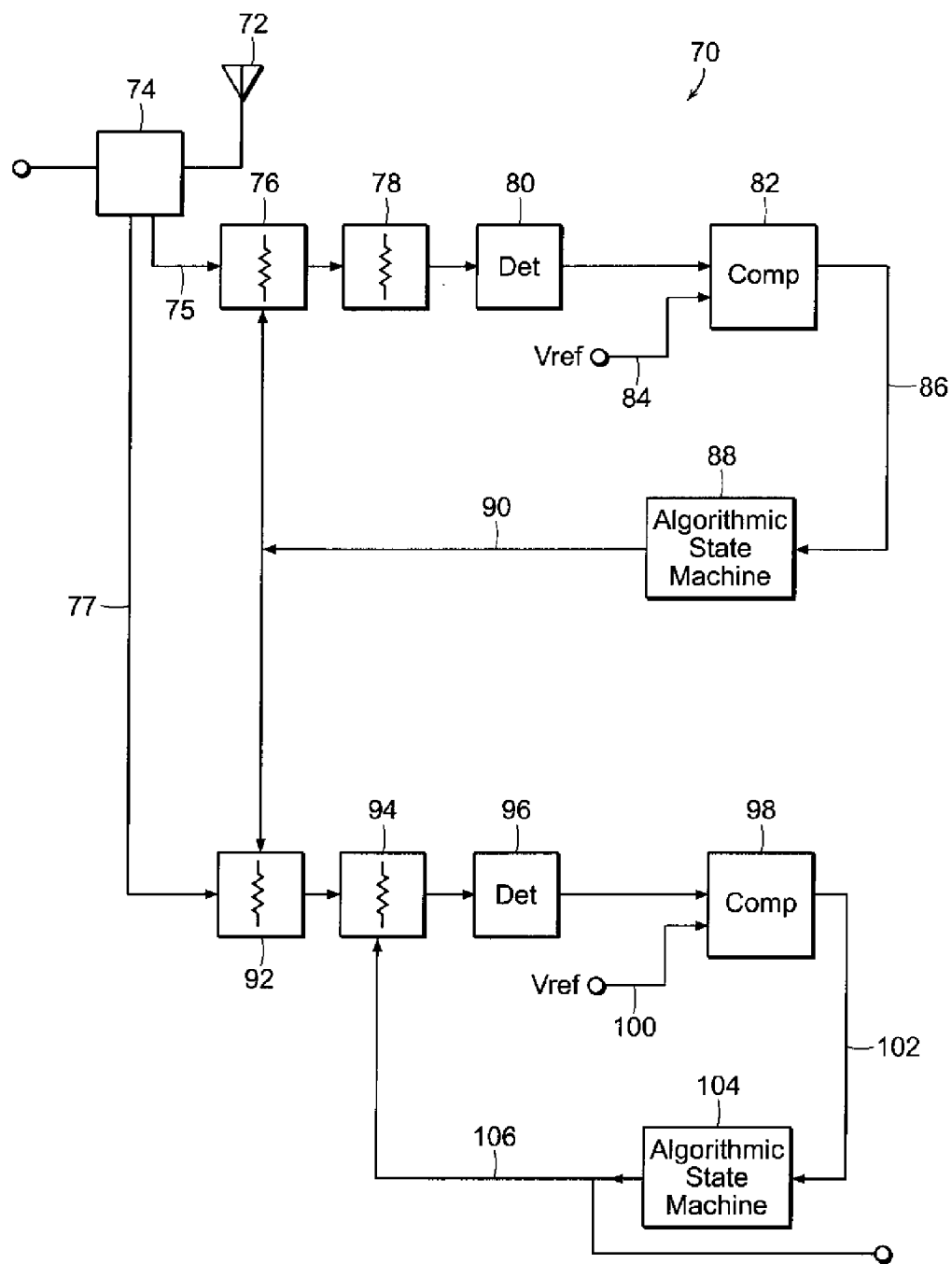
FIGS. 3A and 3B show illustrative diagrammatic views of further power mismatch detectors in accordance with further embodiments of the invention.

In the system 70 shown in FIG. 3A, the forward signal is coupled via a directional coupler 74 to signal path 77 and the reflected signal is coupled to signal path 75. The reflected signal path circuit includes a coarse adjustable attenuator 76 and an attenuator 78. The reverse signal path circuit also includes a detector 80 and a comparator 82 that is also coupled to a reference voltage $V_{ref}$ 84, as well as an algorithmic state machine 88. Similar to the circuit of FIG. 2, the algorithmic state machine 88 will drive the adjustable attenuator such that the output of the detector 80 has a voltage that is substantially equal to $V_{ref}$. To achieve this, the algorithmic state machine 88 adjusts its output 90 until that attenuator 76 is substantially close to $V_{ref}$. The attenuator 78 may be fixed (e.g., in a zero attenuation state) or may additionally be adjustable in other embodiments.

The forward signal path circuit includes a coarse adjustable attenuator 92 and a delta adjustable attenuator 94. The forward signal path circuit also includes a detector 96 and a comparator 98 that is also coupled to a reference voltage $V_{ref}$ 100, as well as an algorithmic state machine 104 that receives an output 102 of the comparator 98. The algorithm state 88 controls the coarse adjustable attenuator 76 as discussed above, and also controls the coarse adjustable attenuator 92 as shown. Then, and similar to the circuit of FIG. 2, the algorithmic state machine 104 will drive the delta adjustable attenuator 94 such that the output of the detector 96 has a voltage that is substantially equal to $V_{ref}$. The system output (that is representative of the mismatch between the forward and reverse power) is provide at the output 106 of the algorithmic state machine 104 as shown.

For example, consider that the reflected power signal 75 is −20 dBm, the forward power signal 77 is −10 dBm, the output of 78 is at −25 dBm when the output of detector 80 is substantially equal to $V_{ref}$ 84, and the output of 94 is at −25 dBm when the output of detector 98 is substantially equal to $V_{ref}$ 100. The input to the detector 80 is set to −25 dBm by virtue of the algorithmic state machine 88 adjusting attenuator 76 to a value of 5 dB, which also adjusts the value of the attenuator 92 to 5 dB. The value of delta attenuator 94 is initially 0 dB, so the input to detector 96 is initially −15 dBm. The input to the detector 96 is set to −25 dBm by virtue of the algorithmic state machine 104 adjusting attenuator 94 to a value of 10 dB, which is the output 106 representing the return loss, which is the difference between the forward power of −10 dBm and reflected power of −20 dBm. The $V_{refs}$ 84, 100 may be the same in this embodiment, or in other embodiments, they may be different. In further embodiments, the forward path may be adjusted by adjusting one of the $V_{refs}$.

Figure 3B:
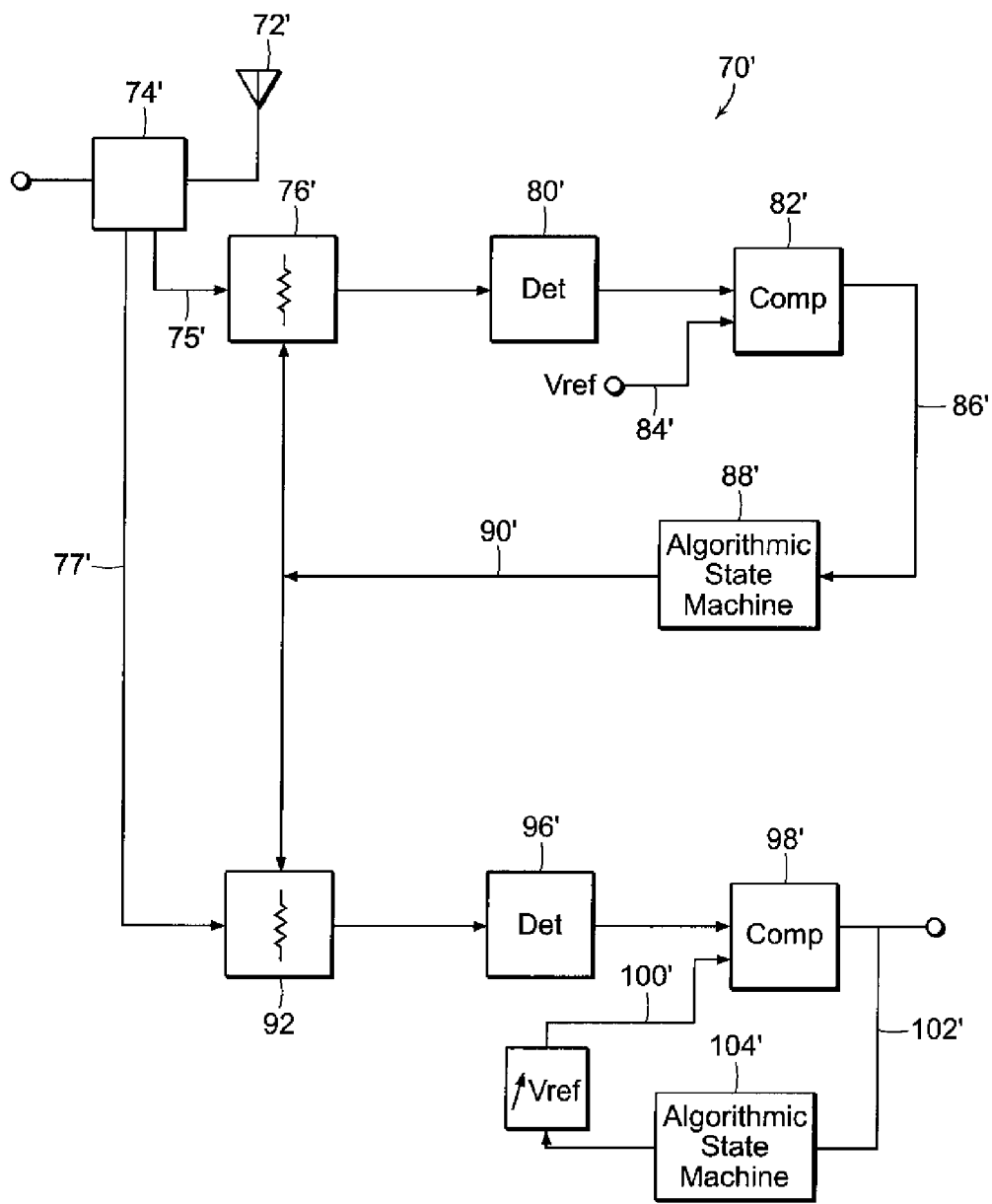

For example, in the system 70' shown in FIG. 3B, the forward signal is coupled via a directional coupler 74' to forward signal path 77' and the reverse signal is coupled to reverse signal path 75'. The reverse signal path circuit includes a coarse adjustable attenuator 76'. The reverse signal path circuit also includes a detector 80' and a comparator 82' that is also coupled to a reference voltage $V_{ref}$ 84', as well as an algorithmic state machine 88'. Similar to the circuit of FIG. 3A, the algorithmic state machine 88' will drive the adjustable attenuator such that the output of the detector 80' has a voltage that is substantially equal to $V_{ref}$.

The forward signal path circuit includes a coarse adjustable attenuator 92', a detector 96' and a comparator 98' that is also coupled to a reference voltage $V_{ref}$ 100', as well as an algorithmic state machine 104' that receives an output 102' of the comparator 98. In this embodiment, the algorithmic state machine 88' controls the adjustable attenuator 76' as discussed above, and also controls the adjustable attenuator 92' as shown. Then, the algorithmic state machine 104 will drive the $V_{ref}$ 100' such that the output of the detector 96' has a voltage that is substantially equal to $V_{ref}$ 100'. The system output (that is representative of the mismatch between the forward and reflected power) is provide at the output 102' of the comparator 98' as shown.

In this embodiment, therefore, the voltage at $V_{ref}$ 100 is swept across a range of voltages, and the system looks for where the output of 98 toggles in polarity. The return loss is then provided by the outputs of the ratio of $V_{ref}$ 84 to $V_{ref}$ 100. For example, consider that the reflected power signal 75' is −20 dBm, the forward power signal 77' is −10 dBm, the output of 76' is at −25 dBm when the output of detector 80' is substantially equal to $V_{ref}$ 84', and the output of 92' is at −25 dBm when the output of detector 96' is substantially equal to $V_{ref}$ 100'. The input to the detector 80' is set to −25 dBm by virtue of the algorithmic state machine 88' adjusting attenuator 76' to a value of 5 dB, which also adjusts the value of the attenuator 92' to 5 dB. The value of $V_{ref}$ 100' is adjusted by the algorithmic state machine 104', and the amount of the adjustment of $V_{ref}$ 100' is indicative of the return loss, which is the difference between the forward power of −10 dBm and reflected power of −20 dBm.

Power detector systems of certain embodiment of the invention combine a peak detector with a linear control law, and a digitally switched attenuator (DSA) with a logarithmic control law to provide a function that has a wide dynamic range linear power detection. The system is in a control loop, where the DSA is controlled by a successive approximation register (SAR) or other suitable A/D converter sensing the output voltage of the detector. The resulting digital input to the DSA represents a sample of the input power in logarithmic terms, and the output voltage represents the instantaneous ratio of the input power to the digital sample in linear terms.

Figure 4:
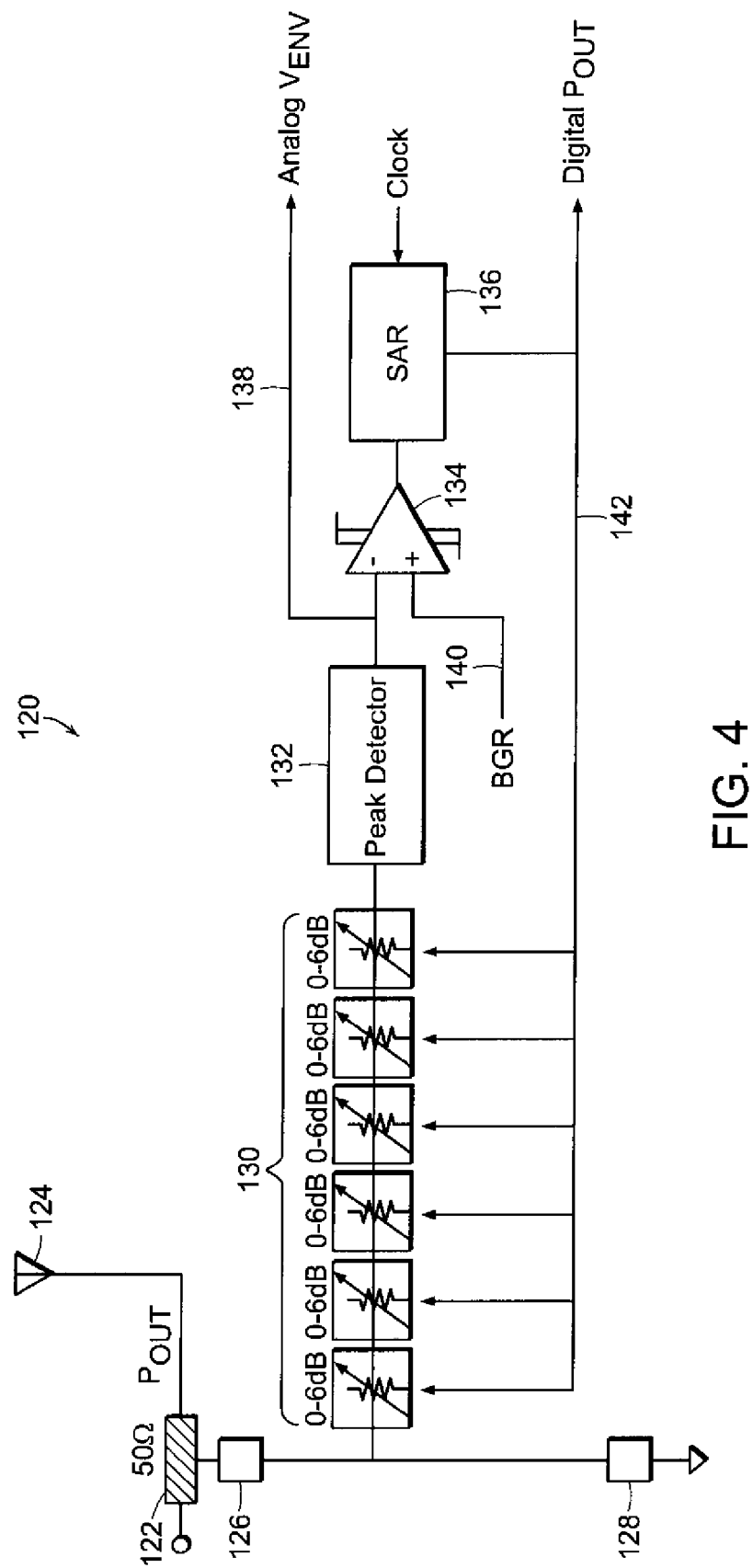
FIG. 4 shows an illustrative view of a detector circuit in accordance with an embodiment of the invention.

As shown in FIG. 4, a system 120 in accordance with an embodiment of the invention may include a coupling circuit that includes a coupler 122 (e.g., 50Ω), a first discrete element 126 (e.g., a resistor) and a second discrete element 128 (e.g., another resistor). The coupling circuit couples an adjustable comparator circuit to a transmission signal of a wireless communication device having an antenna 124. The adjustable comparator circuit includes a set of logarithmically adjustable comparators 130 (e.g., a resistive digitally controlled attenuator circuit), a peak detector 132, and a comparator 134. The comparator 134 compares the output of the peak detector to a reference voltage 140 (e.g., a CMOS bandgap reference). The output of the comparator 134 is provided to a successive approximation register 136, which is an algorithmic state machine that provides controls signal to the set of logarithmically adjustable comparators 130. In further embodiments, the successive approximation register 136 may be any of a variety of algorithmic state machines, such as another binary search tree, or a linear search algorithm device.

The successive approximation register 136 iteratively adjusts the logarithmically adjustable comparator 130 until the output of the peak detector is substantially close to the reference voltage 140. An analog output signal 138 is provided by the output of the peak detector when the iterations cease, and a digital output signal 142 is provided by the output of the successive approximation register when the iterations cease. The analog output signal 138 provides an indication of an instantaneous envelope voltage, and the digital output signal 142 represents the average power level.

By sampling the signal and providing set of adjustable attenuators that are logarithmically weighted, a wide dynamic range is provided without the use of a log amplifier. The peak detector may, therefore, be a narrow band peak detector. While a log amplifier may require operating power on the order of milliamps for 10 db of dynamic range, systems of certain embodiments of the invention may require operating power on the order of tens of microamps for 60 db of dynamic range. This provides a substantial power savings for the power detector circuit.

Figure 5:
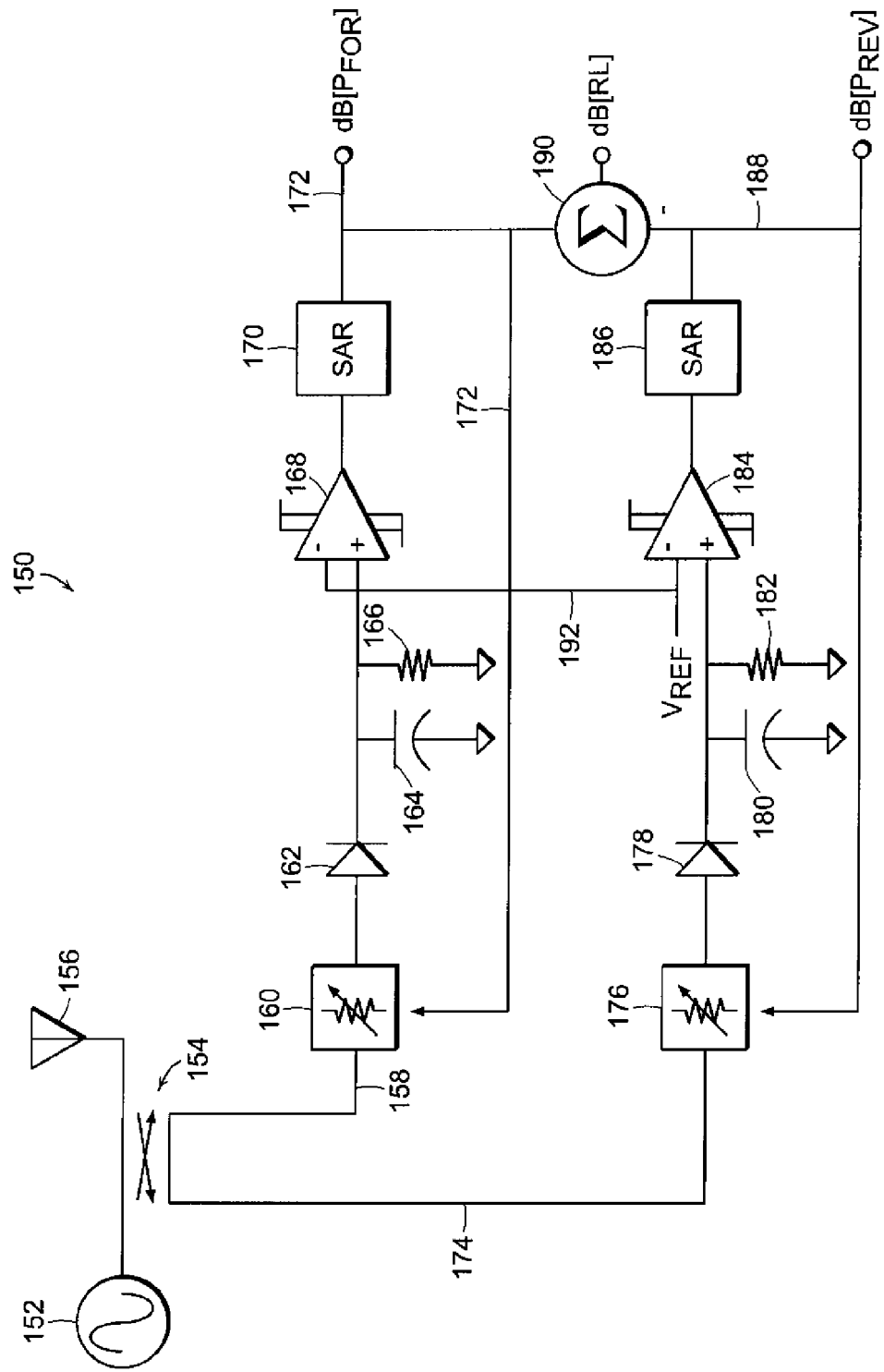
FIG. 5 shows an illustrative view of a power mismatch detector circuit in accordance with a further embodiment of the invention.

In accordance with a further embodiment of the invention, a power mismatch detector system may be provided that determines a mismatch between two power levels, e.g., a transmit power and a return power. The return power may represent reflected power from an antenna coupler in a wireless transmission system. The difference represents the return loss for the system. FIG. 5 shows a system 150 in accordance with an embodiment of the invention that includes a transmit signal source 152 (having a transmit power) that is coupled to an antenna 156. A directional coupler 154 is provided in the signal path, and the directional coupler provides a forward transmission signal to one path 158, and reflected signal to a second path 174.

The forward signal path includes a logarithmically adjustable attenuator 160, a detector circuit (that is functionally represented herein as a diode 162 and filter circuit functionally represented as a capacitor 164 and a resistor 166), a comparator 168 and a successive approximation register 170 that provides a control signal 172 to the logarithmically adjustable attenuator 160. The reflected signal path includes a logarithmically adjustable attenuator 176, a detector circuit (that is functionally represented herein as a diode 178 and a filter circuit functionally represented as a capacitor 180 and a resistor 182), a comparator 184 and a successive approximation register 186 that provides a control signal 188 to the logarithmically adjustable attenuator 176. The reference voltage 192 is the same for both comparators 168 and 184, but could be different in other embodiments. In further embodiments, the successive approximation registers 170, 186 may be any of a variety of algorithmic state machines, such as other binary search trees, or linear search algorithm devices.

The implementation of the detector circuit may be provided by any of a variety of peak detector circuits, and in certain embodiments a combined detector and comparator circuit may be provided with CMOS transistors as disclosed, for example, in U.S. patent application Ser. No. 12/197,636 filed Aug. 25, 2008, the disclosure of which is hereby incorporated by reference in its entirety.

In this embodiment, the reference voltage is set to a value that represents a peak voltage for an expected transmitter power level. Once iterations cease in each of the forward and reverse signal paths, the difference between the forward path control signal is provided as a digital output signal by a summation device 190. This digital output provides a representation of the difference between the forward power and the reflected power, which represents signal loss. Knowing this information, may permit a transmission system to adjust the transmitter power so as to reduce the amount of this loss in a wireless communication system.

For example, if a forward power were −20 dB and the antenna had a 6 dB return loss, then the signal 158 would be at −20 dB and the signal 174 would be at −26 dB. The forward path attenuator 160 would become adjusted to provide an offset of $\alpha_1$, and the reverse path attenuator 176 would become adjusted to provide an offset of $\alpha_2$. The successive approximation registers switch between attenuator states until it finds that the output of the associated comparator is within on least significant bit (lsb) of the reference voltage. Once iterations ceased, the output would provide a digital signal of $\alpha_1$-$\alpha_2$, which represents the mismatch power.

Figure 6:
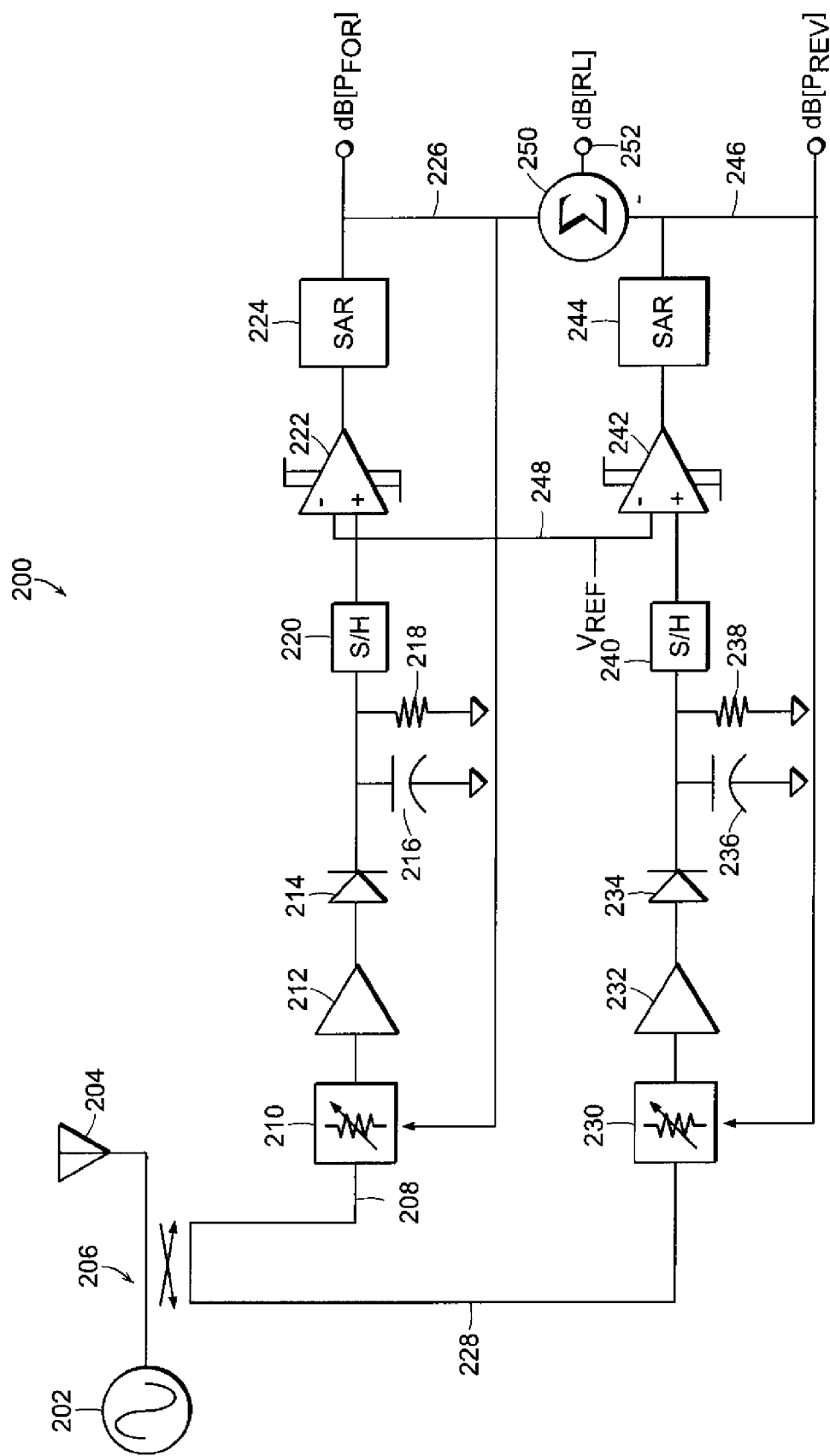
FIG. 6 shows an illustrative view of a power mismatch detector circuit in accordance with a further embodiment of the invention that provides further dynamic range.

A system in accordance with a further embodiment of the invention is shown in FIG. 6 that additionally includes an amplifier and a sample and hold circuit in each of the forward and return signal paths prior to the associated peak detector circuits. In particular, FIG. 6 shows a system 200 in accordance with an embodiment of the invention that includes a transmit signal source 202 (having a transmit power) that is coupled to an antenna 204. A directional coupler 206 is provided in the signal path, and the directional coupler provides a forward power signal to one path 208, and reflected signal power to a second path 228.

The forward signal path includes a logarithmically adjustable attenuator 210, an amplifier 212 (e.g., providing 18 dB or 25 dB of gain), a detector circuit (that is functionally represented herein as a diode 214 and a filter circuit functionally represented as a capacitor 216 and a resistor 218), a sample and hold circuit 220, a comparator 222 and a successive approximation register 224 that provides a control signal 226 to the logarithmically adjustable attenuator 210. The reverse signal path includes a logarithmically adjustable attenuator 230, an amplifier 232 (e.g., providing 18 dB or 25 dB of gain), a detector circuit (that is functionally represented herein as a diode 234 and a filter circuit functionally represented as a capacitor 236 and a resistor 238), a sample and hold circuit 240, a comparator 242 and a successive approximation register 244 that provides a control signal 246 to the logarithmically adjustable attenuator 230. In further embodiments, the successive approximation registers 224, 244 may be any of a variety of algorithmic state machines, such as other binary search trees, or thermometer search algorithm devices, or linear search algorithm devices.

The reference voltage 248 is the same for both comparators 222 and 242, but could be different in other embodiments. In the embodiment of FIG. 6, the reference voltage is set to a value that represents a peak voltage for an expected transmitter power level. Once iterations cease in each of the forward and reverse signal paths, the difference between the forward path control signal is provided as a digital output signal 252 by a summation device 250. This digital output signal 252 provides a representation of the difference between the forward power and the reflected power, which represents signal loss.

Again, the implementation of the detector circuits may be provided as discussed above with reference to FIG. 5. In accordance with other embodiments, P-channel transistors could be used with appropriate inversions of polarities and references, and in accordance with further embodiments of the invention, other transistor such as bipolar transistors may also be used.

The system provides wide dynamic range using a matched power range and target return loss. The detector voltage may be set, for example at 100 mV, and the coupling ratio may be 18 dB or 25 dB.

Figure 7:
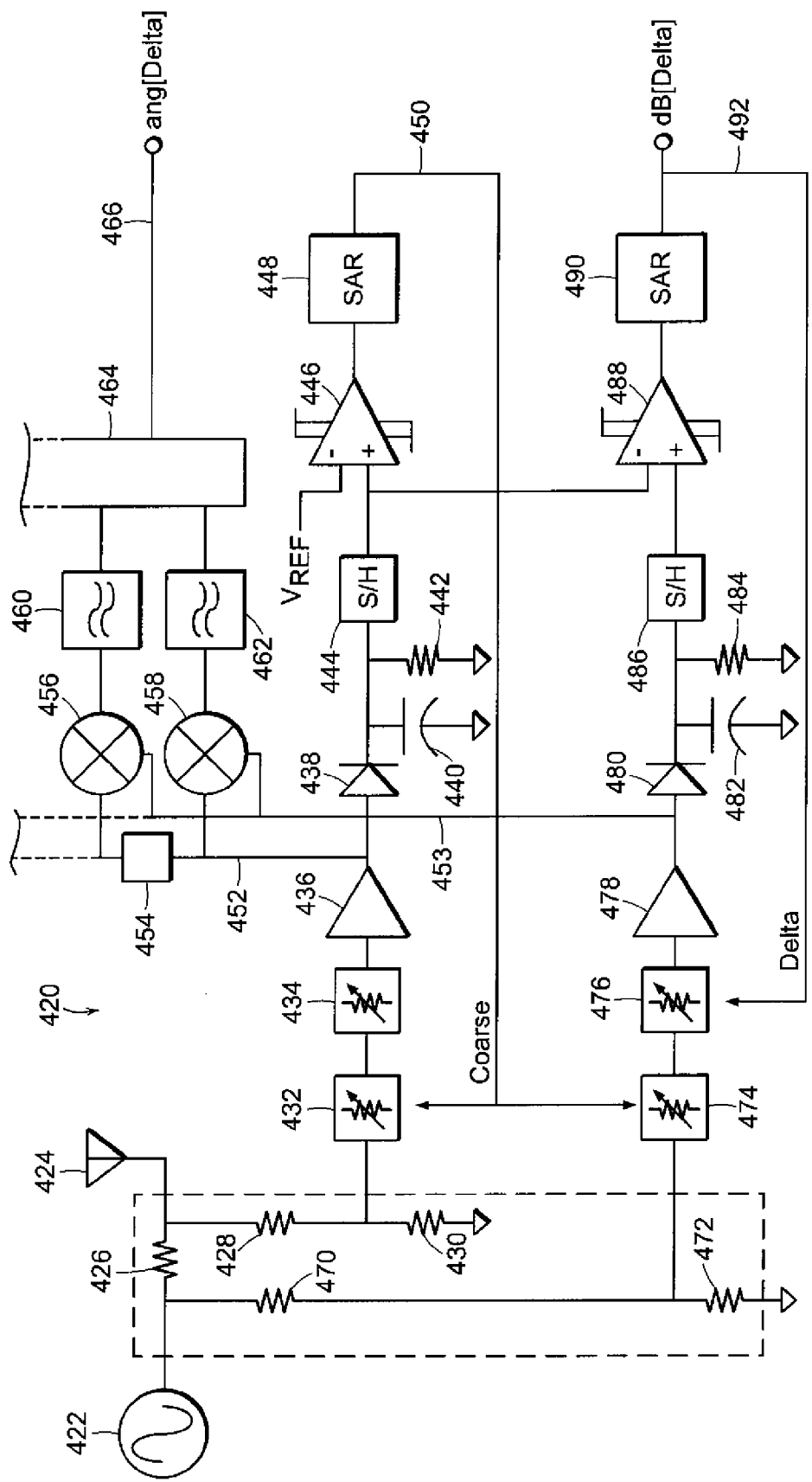
FIG. 7 shows an illustrative view of a power mismatch detector circuit in accordance with a further embodiment of the invention that provides voltage sensing.

In a system in accordance with a further embodiment of the invention, the system may include a coupling circuit that is provided as a network of discrete circuit elements. FIG. 7, for example, shows a coupling network of discrete circuit elements that includes resistors 426, 428, 430, 470 and 472. The system has a forward signal path and a reflected signal path. The forward signal path includes a coarse logarithmically adjustable attenuator 432, a delta logarithmically adjustable attenuator 434 (that may be set to fixed non-attenuating state), an amplifier 436, a detector circuit (that is functionally represented herein as a diode 438 and a filter circuit functionally represented as a capacitor 440 and a resistor 442), a sample and hold circuit 444, a comparator 446 and a successive approximation register 448 that provides a control signal 450 to the logarithmically adjustable attenuator 432.

The reflected signal path includes a coarse logarithmically adjustable attenuator 474, a delta logarithmically adjustable attenuator 476, an amplifier 478, a detector circuit (that is functionally represented herein as a diode 480 and a filter circuit functionally represented as a capacitor 482 and a resistor 484), a sample and hold circuit 486, a comparator 488 and a successive approximation register 490 that provides a control signal 492 to the delta logarithmically adjustable attenuator 476. The control signal 450 from the forward signal path is provided to the coarse logarithmically adjustable attenuator 474. In further embodiments, the successive approximation registers 448, 490 may be any of a variety of algorithmic state machines, such as other binary search trees, or linear search algorithm devices.

Again, the implementation of the detector circuits may be provided as discussed above with reference to FIG. 5. In accordance with other embodiments, P-channel transistors could be used with appropriate inversions of polarities and references, and in accordance with further embodiments of the invention, other transistor such as bipolar transistors may also be used.

During use, the iterative attenuation process is first performed on the forward path, causing the coarse attenuator 474 of the reflected path to be set. The iterative attenuation process is then performed on the reflected path, and the delta is provided by the control signal 492 as the digital output.

In further embodiments in which it may also be desirable to determine a phase difference between the forward signal and the reflected signal, an optional angle detection circuit may further be used with the system of FIG. 7 as follows. The angle detection circuit includes a first mixer 456 that is coupled via a 90 degree phase shift device 454 to the output 452 of the amplifier 436 in the forward signal path, and a second mixer 458 that is coupled to the output 453 of the amplifier 478 in the reflected signal path. The outputs of the mixers 456, 458 are provided via filters 460, 462 to an encoder 464, which provides an output signal 466 that is proportional to a phase difference between the forward power and the reflected power. If the antenna 424 is capacitive, then the voltage on the antenna side will have a phase lag with respect to the phase at 422. If the antenna 424 is inductive, it will have a phase that leads that phase at 422. The output 466 includes two bits that together indicate which of four phase quadrants is associated with the reflected power from the antenna 524. In further embodiments, the successive approximation registers 540, 558 may be any of a variety of algorithmic state machines, such as other binary search trees, or linear (e.g., thermometer) search algorithm devices.

In further embodiments, additional mixers may be coupled (via phase shifters at angles other than 90 degrees) to the forward path signal and the reflected path signal. These additional mixers at different angles may be employed to further identify not only the quadrant of a reflected signal phase, but also to obtain a more precise angle or range of angles associated with the reflected power signal.

Figure 8:
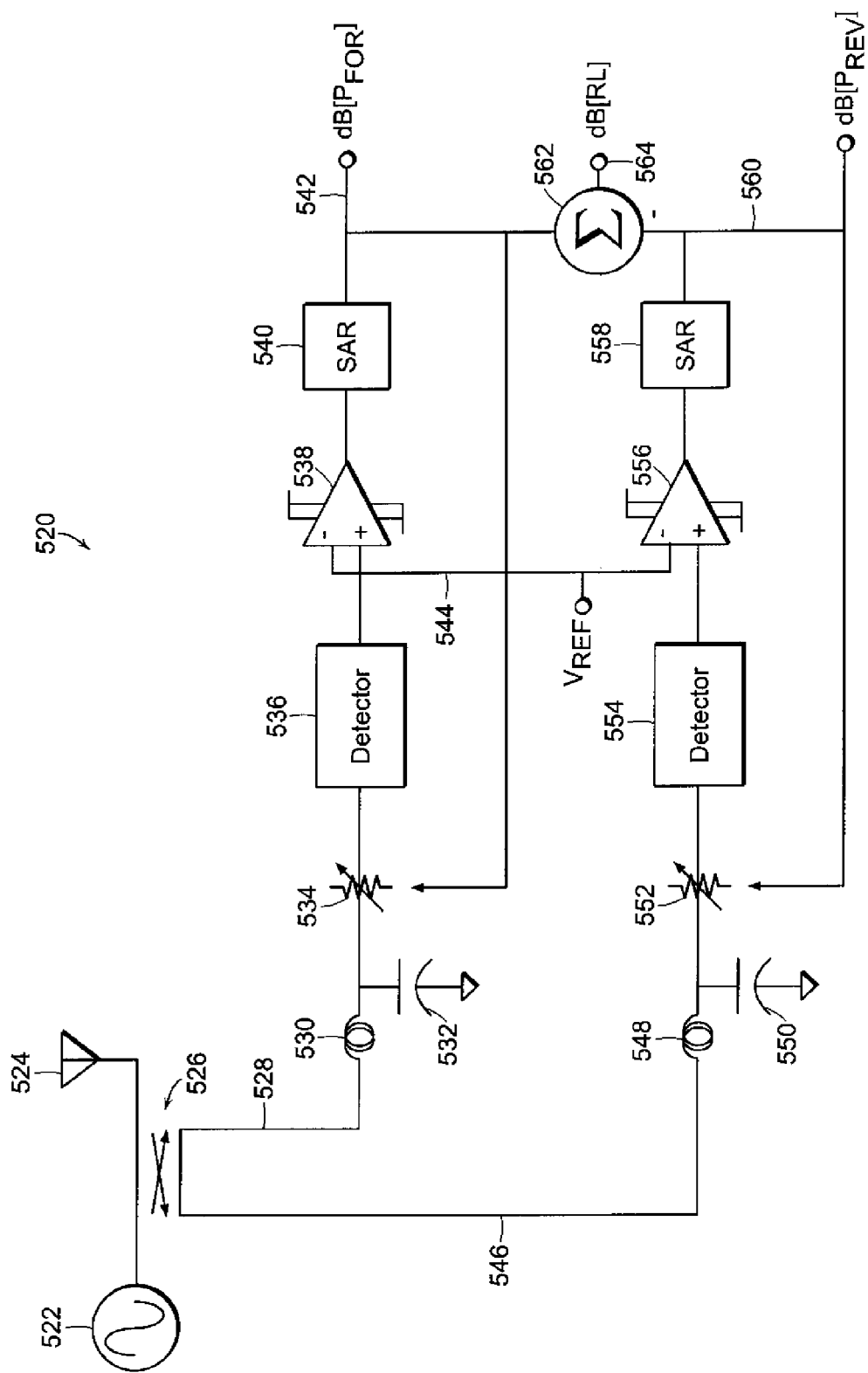
FIG. 8 shows an illustrative view of a power mismatch detector circuit in accordance with a further embodiment of the invention that provides angle detection.

FIG. 8 shows a system 520 in accordance with yet a further embodiment of the invention. A directional coupler 526 couples forward and reflected power signals from a transmitter source 522 to an antenna 524. The forward path 528 includes an impedance transforming network (functionally shown herein as an inductor 530 and a capacitor 532), a logarithmically adjustable attenuator 534, a detector 536, a comparator 538 and a successive approximation register 540, the output of which provides a control signal 542 for the adjustable attenuator 534. The reflected path 546 includes an impedance transforming network (functionally shown herein as an inductor 548 and a capacitor 550), a logarithmically adjustable attenuator 552, a detector 554, a comparator 556 and a successive approximation register 558, the output of which provides a control signal 560 for the adjustable attenuator 552. The control signal 560 is subtracted from the control signal 542 at the combiner 562 to provide the output signal 564.

The impedance transforming networks provide voltage amplification without using DC current. This circuit responds to voltage, not power. Voltage amplification is obtained through impedance transformation. The voltage amplification ratio in linear terms is equal to the square root of the impedance ratio, and the voltage amplification in dB is equal to 10*log 10 (impedance ratio). For example, if a transformation was implemented from 50 Ohms to 200 Ohms, the impedance ratio is 4, and the voltage ratio would then be 2 for 6 dB of voltage gain. For an input of 1Vpp (0 dBV), the output would be 2Vpp (6 dBV).

The directional coupler provides a step down in the amount of power out, but also provides isolation between the fore path and the reflected path so that the direction of power flow to or away from the antenna may be discerned.

Those skilled in the art will appreciate that numerous variations and modifications may be made to the above disclosed embodiments without departing from the spirit and scope of the invention.

What is claimed is:

1. A power detection system that determines a power level of a transmission signal, said power detection system including an adjustable comparator circuit that receives the transmission signal and provides an adjusted transmission signal, and further compares the adjusted transmission signal to a reference signal, said adjustable comparator circuit comprising:

an algorithmic state machine that is coupled to a digitally adjustable attenuator and iteratively adjusts the digitally adjustable attenuator until the adjusted transmission signal is substantially close to the reference signal; and an output node coupled to the algorithmic state machine that provides an output signal that is responsive to the power level of the transmission signal and to the reference signal, wherein said adjustable comparator circuit includes a coarse adjustable attenuator and a delta adjustable attenuator, one of which is the digitally adjustable attenuator.

2. The power detection system as claimed in claim 1, wherein said digitally adjustable attenuator includes successive approximation registers.

3. The power detection system as claimed in claim 1, wherein said adjustable comparator circuit is logarithmically adjustable.

4. The power detection system as claimed in claim 2, wherein said adjustable comparator circuit further includes a peak detector that is coupled to an output of the adjustable attenuator, and that provides the adjusted transmission signal.

5. The power detection system as claimed in claim 1, wherein said algorithmic state machine includes a binary search algorithm.

6. The power detection system as claimed in claim 5, wherein said algorithmic state machine includes at least one successive approximation register.

7. The power detection system as claimed in claim 1, wherein said algorithmic state machine includes a linear search algorithm.

8. The power detection system as claimed in claim 1, wherein said adjustable comparator circuit converts an AC amplitude of the transmission signal to a DC voltage for comparison to the reference signal, and wherein the reference signal is a reference voltage.

9. The power detection system as claimed in claim 1, wherein said adjustable comparator circuit receives the transmission signal from a transmitter channel of a wireless communication transmitter circuit.

10. The power detection system as claimed in claim 9, wherein said adjustable comparator circuit receives the transmission signal from the transmitter channel via a directional coupler.

11. The power detection system as claimed in claim 9, wherein said adjustable comparator circuit receives the transmission signal from the transmitter channel via a network of discrete components.

12. The power detection system as claimed in claim 9, wherein said transmission signal is a communication signal provided to a transmission antenna.

13. The power detection system as claimed in claim 9, wherein said transmission signal is a communication signal received from a transmission antenna.

14. The power detection system as claimed in claim 1, wherein a value provided by the algorithmic state machine is provided to the adjustable comparator circuit, and is also provided to another adjustable comparator circuit of another power detection system that receives a second signal and includes a second adjustable comparator circuit that receives the second signal and provides a second adjusted signal, and further compares the second adjusted signal to a second reference signal.

15. The power detection system as claimed in claim 14, wherein said second adjustable comparator circuit adjusts the second reference voltage.

16. A power detection system coupled to a transmission path of a wireless communication circuit, said power detection system comprising:
a first adjustable comparator circuit that receives a transmission signal and provides an adjusted transmission signal, and further compares the adjusted transmission signal to a reference signal, said first adjustable comparator circuit comprising a first algorithmic state machine that is coupled to a first digitally adjustable attenuator and iteratively adjusts the first digitally adjustable attenuator until the adjusted transmission signal is substantially close to the reference signal;
a second adjustable comparator circuit that receives a second signal and provides a second adjusted signal, and further compares the second adjusted signal to a second reference signal, said first adjustable comparator circuit comprising a second algorithmic state machine that is coupled to the second digitally adjustable attenuator and iteratively adjusts the second digitally adjustable attenuator until the second adjusted signal is substantially close to the second reference signal; and
an output node coupled to the second algorithmic state machine that provides an output signal that is responsive to the transmission signal, the second signal, and the first and second reference signals.

17. The power detection system as claimed in claim 16, wherein said transmission signal is an amplitude modulated AC transmission signal coupled to an antenna of the wireless communication circuit, and the second signal is a reflected amplitude modulated AC signal from the antenna.

18. The power detection system as claimed in claim 16, wherein the first digitally adjustable attenuator is a coarse attenuator that is coupled to the first algorithm state machine, and the second digitally adjustable attenuator is a delta attenuator that is coupled to the second algorithm state machine.

19. The power detection system as claimed in claim 16, wherein said output signal is representative of a difference between power levels of the second signal and the transmission signal.

20. The power detection system as claimed in claim 16, wherein said first digitally adjustable attenuator includes successive approximation registers.

21. The power detection system as claimed in claim 20, wherein said second digitally adjustable attenuator includes successive approximation registers.

22. A method of determining a difference between a power level of a forward signal within a transmission channel and a power level of a reflected signal from the transmission channel, said method comprising the steps of:
providing a forward signal to a first comparator;
comparing the adjusted forward signal to a first reference signal, and providing a first digital signal to a first algorithm state machine;
digitally adjusting a first digitally adjustable attenuator responsive to the first algorithm state machine to provide an adjusted forward signal;
further adjusting the adjusted forward signal until the adjusted forward signal is substantially close to the first reference signal;
providing a reflected signal to a second comparator;
comparing the adjusted reflected signal to a second reference signal, and providing a second digital signal to a second algorithm state machine;
digitally adjusting a second digitally adjustable attenuator responsive to the second algorithm state machine to provide an adjusted reflected signal;
further adjusting the adjusted reflected signal until the adjusted reflected signal is substantially close to the second reference signal; and
providing an output signal that is representative of a difference between the power level of the forward signal and the power level of the reflected signal.

23. A power detection system that determines a power level of a transmission signal, said power detection system including an adjustable comparator circuit that receives the transmission signal and provides an adjusted transmission signal, and further compares the adjusted transmission signal to a reference signal, said adjustable comparator circuit comprising:
an algorithmic state machine that is coupled to a digitally adjustable attenuator and iteratively adjusts the digitally adjustable attenuator until the adjusted transmission signal is substantially close to the reference signal; and
an output node coupled to the algorithmic state machine that provides an output signal that is responsive to the power level of the transmission signal and to the reference signal,
wherein a value provided by the algorithmic state machine is provided to the adjustable comparator circuit, and is also provided to another adjustable comparator circuit of another power detection system that receives a second signal and includes a second adjustable comparator circuit that receives the second signal and provides a second adjusted signal, and further compares the second adjusted signal to a second reference signal, and
wherein said second adjustable comparator circuit adjusts the second reference voltage.

24. The power detection system as claimed in claim 23, wherein said adjustable comparator circuit is logarithmically adjustable.

25. The power detection system as claimed in claim 24, wherein said adjustable comparator circuit further includes a peak detector that is coupled to an output of the adjustable attenuator, and that provides the adjusted transmission signal.

26. The power detection system as claimed in claim 23, wherein said adjustable comparator circuit includes a coarse adjustable attenuator and a delta adjustable attenuator, one of which is the digitally adjustable attenuator.

27. The power detection system as claimed in claim 23, wherein said algorithmic state machine includes a binary search algorithm.

28. The power detection system as claimed in claim 27, wherein said algorithmic state machine includes at least one successive approximation register.

29. The power detection system as claimed in claim 23, wherein said algorithmic state machine includes a linear search algorithm.

30. The power detection system as claimed in claim 23, wherein said adjustable comparator circuit converts an AC amplitude of the transmission signal to a DC voltage for comparison to the reference signal, and wherein the reference signal is a reference voltage.

31. The power detection system as claimed in claim 23, wherein said adjustable comparator circuit receives the transmission signal from a transmitter channel of a wireless communication transmitter circuit.

32. The power detection system as claimed in claim 31, wherein said adjustable comparator circuit receives the transmission signal from the transmitter channel via a directional coupler.

33. The power detection system as claimed in claim 31, wherein said adjustable comparator circuit receives the transmission signal from the transmitter channel via a network of discrete components.

34. The power detection system as claimed in claim 31, wherein said transmission signal is a communication signal provided to a transmission antenna.

35. The power detection system as claimed in claim 31, wherein said transmission signal is a communication signal received from a transmission antenna.

* * * * *